United States Patent
Park

(10) Patent No.: US 10,877,857 B2
(45) Date of Patent: Dec. 29, 2020

(54) MEMORY SYSTEM AND METHOD OF OPERATING THE SAME

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 240 days.

(21) Appl. No.: 16/107,274

(22) Filed: Aug. 21, 2018

(65) Prior Publication Data

US 2019/0235976 A1 Aug. 1, 2019

(30) Foreign Application Priority Data

Jan. 29, 2018 (KR) .................. 10-2018-0010854

(51) Int. Cl.
   *G06F 11/00* (2006.01)
   *G06F 11/16* (2006.01)
   *G06F 12/02* (2006.01)

(52) U.S. Cl.
   CPC ........ *G06F 11/167* (2013.01); *G06F 12/0246* (2013.01)

(58) Field of Classification Search
   CPC .... G06F 3/0659; G06F 3/0619; G06F 11/073; G06F 11/079; G06F 11/0793; G06F 12/026; G06F 12/06; G06F 12/063; G06F 12/0276; Y02D 10/13
   See application file for complete search history.

(56) References Cited

U.S. PATENT DOCUMENTS

| | | | | |
|---|---|---|---|---|
| 4,933,846 A | * | 6/1990 | Humphrey | G06F 12/1466 370/463 |
| 5,251,308 A | * | 10/1993 | Frank | G06F 9/3005 711/163 |
| 5,586,291 A | * | 12/1996 | Lasker | G06F 11/1435 711/113 |

(Continued)

FOREIGN PATENT DOCUMENTS

KR    1020130078973    7/2013

OTHER PUBLICATIONS

Love, "Linux Kernel Development", Jan. 2005,Sams Publishing, pp. 1-8 (Year: 2005).*

(Continued)

*Primary Examiner* — Bryce P Bonzo
*Assistant Examiner* — Jeison C Arcos
(74) *Attorney, Agent, or Firm* — IP & T Group LLP

(57) ABSTRACT

Provided herein may be a memory system and a method of operating the memory system. The memory system may include: a memory device comprising a plurality of semiconductor devices each including a plurality of memory blocks; and a controller configured to generate at least one or more descriptors in response to a request from a host, and control internal operations of the plurality of semiconductor devices based on the respective at least one or more descriptors. The controller may generate and manage at least one or more descriptor indexes respectively corresponding to the at least one or more descriptors. When a failure occurs during the internal operations of the plurality of semiconductor devices, at least one descriptor corresponding to a memory block in which the failure has occurred is searched for using the at least one or more descriptor indexes.

20 Claims, 8 Drawing Sheets

(56) References Cited

U.S. PATENT DOCUMENTS

| | | | | |
|---|---|---|---|---|
| 6,701,393 B1* | 3/2004 | Kemeny | ............... | G06F 12/122 710/40 |
| 7,114,016 B2* | 9/2006 | Yang | ............... | H04L 49/90 709/213 |
| 8,161,392 B1* | 4/2012 | Hobbs | ............... | H04L 67/08 715/736 |
| 8,176,252 B1* | 5/2012 | Alexander | ............... | G06F 13/28 711/118 |
| 9,081,671 B2* | 7/2015 | Rousseau | ............... | G06F 3/0604 |
| 2005/0132162 A1* | 6/2005 | Reese | ............... | G06F 9/5016 711/170 |
| 2005/0138212 A1* | 6/2005 | Yang | ............... | H04L 49/9047 709/250 |
| 2005/0216691 A1* | 9/2005 | Michael | ............... | G06F 9/5016 711/170 |
| 2005/0216721 A1* | 9/2005 | Zimmer | ............... | G06F 9/4401 713/2 |
| 2006/0129901 A1* | 6/2006 | Arataki | ............... | G11B 20/1217 714/752 |
| 2007/0214333 A1* | 9/2007 | Nijhawan | ............... | G06F 13/4243 711/165 |
| 2010/0070695 A1* | 3/2010 | Baek | ............... | G06F 12/023 711/104 |
| 2011/0072028 A1* | 3/2011 | Rousseau | ............... | G06F 3/065 707/758 |
| 2011/0185113 A1* | 7/2011 | Goss | ............... | G06F 12/0253 711/103 |
| 2011/0296087 A1* | 12/2011 | Kim | ............... | G06F 12/0246 711/103 |
| 2011/0320688 A1* | 12/2011 | Lee | ............... | G06F 12/0246 711/103 |
| 2012/0023364 A1* | 1/2012 | Swanson | ............... | G06F 11/004 714/6.12 |
| 2012/0233523 A1* | 9/2012 | Krishnamoorthy | ... | H03M 13/05 714/758 |
| 2013/0054928 A1* | 2/2013 | Im | ............... | G06F 12/0246 711/170 |
| 2013/0067179 A1 | 3/2013 | Paleologu et al. | | |
| 2016/0322990 A1* | 11/2016 | Tuers | ............... | H03M 13/2909 |
| 2018/0150247 A1* | 5/2018 | Park | ............... | G06F 3/0659 |
| 2019/0188134 A1* | 6/2019 | Jeong | ............... | G11C 29/52 |
| 2019/0278704 A1* | 9/2019 | Lee | ............... | G06F 3/064 |

OTHER PUBLICATIONS

Cuesta, "Increasing the Effectiveness of Directory Caches by deactivating Coherence for Private Memory Blocks", Jun. 2011, ACM, pp. 1-11 (Year: 2011).*

* cited by examiner

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2018-0010854, filed on Jan. 29, 2018, the entire disclosure of which is incorporated herein by reference in its entirety.

BACKGROUND

1. Field of Invention

Various embodiments of the present disclosure generally relate to a memory system and a method of operating the memory system. Particularly, the embodiments relate to a memory system capable of preventing an error from occurring due to duplicate registration of a bad block, and a method of operating the memory system.

2. DESCRIPTION OF RELATED ART

Recently, the computer environment paradigm has shifted to ubiquitous computing in which computer systems can be used anytime and anywhere. As a result, the use of portable electronic devices such as mobile phones, digital cameras, and laptop computers has rapidly increased. In general, such portable electronic devices use a memory system which employs a memory device, in other words, a data storage device. The data storage device is used as a main memory device or an auxiliary memory device of the portable electronic devices.

Since there is no mechanical driving part, a data storage device using a memory device provides advantages such as excellent stability and durability, increased information access speed, and low power consumption. Data storage devices, as an example of the memory system having such advantages, may include a universal serial bus (USB) memory device, a memory card having various interfaces, and a solid state drive (SSD).

SUMMARY

Various embodiments of the present disclosure are directed to a memory system capable of preventing, when a failure occurs in a memory block during an operation thereof, duplicate registration of a bad block using a descriptor corresponding to the failed memory block among descriptors of memory blocks on which operations have not been performed.

An embodiment of the present disclosure may provide for a memory system including: a memory device comprising a plurality of semiconductor devices each including a plurality of memory blocks; and a controller configured to generate at least one or more descriptors in response to a request from a host, and control internal operations of the plurality of semiconductor devices based on the respective at least one or more descriptors. The controller may generate and manage at least one or more descriptor indexes respectively corresponding to the at least one or more descriptors. When a failure occurs during the internal operations of the plurality of semiconductor devices, at least one descriptor corresponding to a memory block in which the failure has occurred may be searched for using the at least one or more descriptor indexes.

An embodiment of the present disclosure may provide for a method of operating a memory system, including: generating a plurality of descriptors and a plurality of descriptor indexes corresponding to the plurality of descriptors, in response to a request received from a host; controlling a plurality of semiconductor memories to perform internal operations based on the plurality of descriptors; registering, when a failure occurs during the internal operations, a memory block in which the failure has occurred as a bad block; searching for at least one descriptor index corresponding to the memory block in which the failure has occurred among the plurality of descriptor indexes; and generating at least one new descriptor based on the searched at least one descriptor index.

An embodiment of the present disclosure may provide for a memory system, including: a plurality of memory devices each including a plurality of memory blocks; and a controller configured to generate a plurality of descriptors and respectively corresponding indexes for controlling the memory devices to perform operation to the memory blocks, the indexes including information of the memory blocks respectively allocated for the operations, wherein the controller allocates, when an operation fails to a bad block among the memory blocks, another memory block for one or more descriptors corresponding to the bad block among the descriptors by using the indexes.

DETAILED DESCRIPTION

Figure 1:
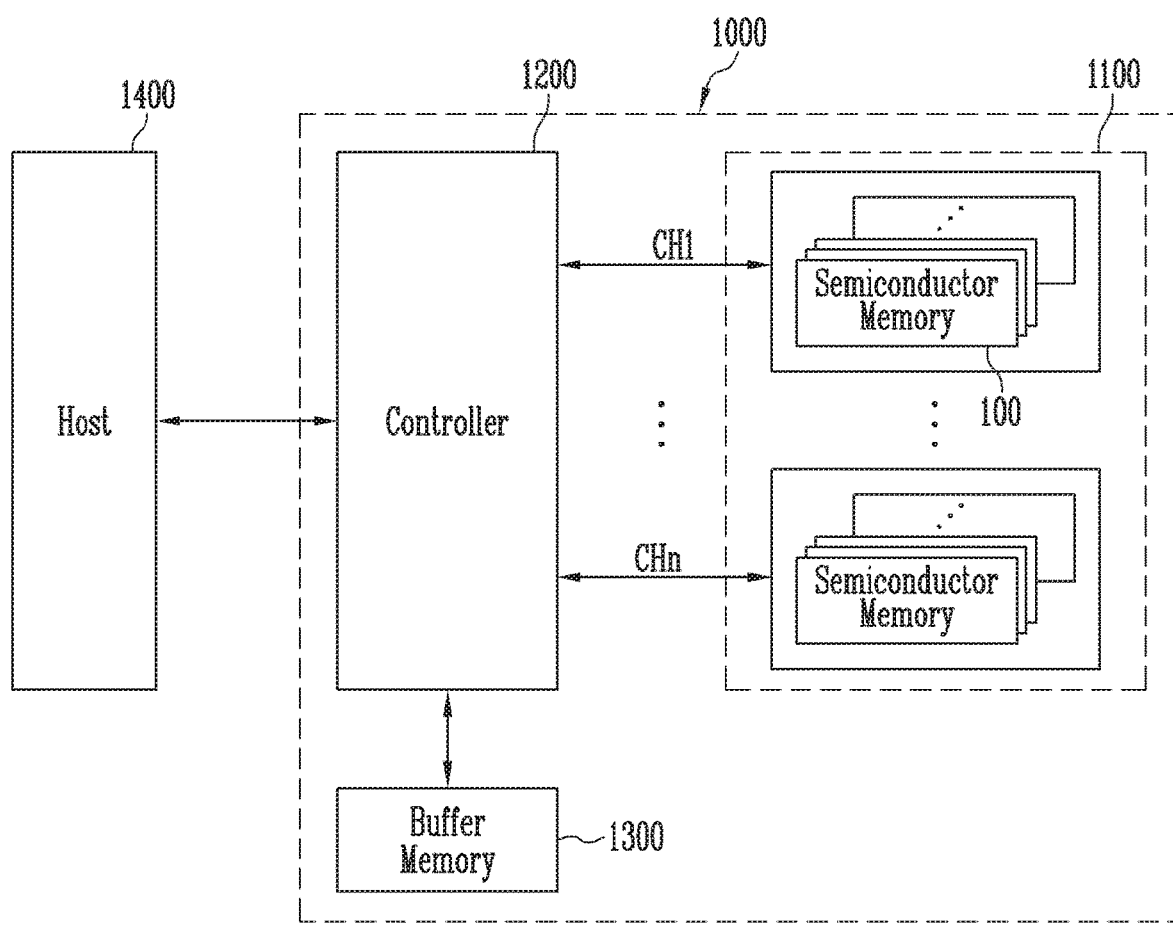
FIG. 1 is a block diagram illustrating a memory system in accordance with an embodiment of the present disclosure.

Various embodiments will now be described more fully with reference to the accompanying drawings; however, elements and features of the present disclosure may be arranged or configured differently than shown or described herein. Thus, the present invention is not limited to the embodiments set forth herein. Rather, these embodiments are provided so that this disclosure is thorough and complete and fully conveys the scope of the embodiments to those skilled in the art. Throughout the specification, reference to "an embodiment" or the like is not necessarily to only one embodiment, and different references to "an embodiment" or the like are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present.

Embodiments are described herein with reference to sectional and schematic illustrations of elements and intermediate structures. As such, variations from the shapes shown in the illustrations as a result, for example, of manufacturing techniques and/or tolerances, are to be expected. Thus, embodiments should not be construed as limited to particular shapes of elements, structures or regions thereof illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they do not limit the various components. Those terms are used for the purpose of differentiating a component from other components having the same or similar names. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless the context indicates otherwise. Furthermore, "include/comprise" or "including/comprising" used in the specification represents that one or more components, steps, operations, and elements exist or are added but does not preclude the existence or addition of other component(s), step(s), operation(s) and/or element(s).

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly to connected/directly coupled" refers to one component directly coupling another component without an intermediate component.

FIG. 1 is a block diagram illustrating a memory system 1000 in accordance with an embodiment of the present disclosure.

Referring to FIG. 1, the memory system 1000 may include a memory device 1100, a controller 1200, and a buffer memory 1300. The memory device 1100 may include a plurality of semiconductor memories 100. The plurality of semiconductor memories 100 may be divided into a plurality of groups.

In FIG. 1, it is illustrated that the plurality of groups (e.g., n groups) communicate with the controller 1200 through first to n-th channels CH1 to CHn, respectively. Each semiconductor memory 100 will be described in detail with reference to FIG. 3.

Each group may communicate with the controller 1200 through one channel common to each semiconductor memory 100 in that group. The controller 1200 may control the plurality of memories 100 of the memory device 1100 through the plurality of channels CH1 to CHn.

The controller 1200 is connected between a host 1400 and the memory device 1100. The controller 1200 may access the memory device 1100 in response to a request from the host 1400. For example, the controller 1200 may control a read operation, a write operation, an erase operation, and a background operation of the memory device 1100 in response to a request received from the host 1400. The controller 1200 may provide an interface between the memory device 1100 and the host 1400. The controller 1200 may run firmware for controlling the memory device 1100.

When a read operation is performed in response to a request from the host 1400, the buffer memory 1300 may temporarily store data read from the memory device 1100 and then output the data to the host 1400. When a write operation is performed, the buffer memory 1300 may temporarily store data received from the host 1400 and then output the data to the memory device 1100. In FIG. 1, the buffer memory 1300 is illustrated as being a separate component from the controller 1200, but the controller 1200 may include the buffer memory 1300.

The host 1400 may control the memory system 1000. The host 1400 may include a portable electronic device such as a computer, a personal digital assistant (PDA), a portable multimedia player (PMP), an MP3 player, a camera, a camcorder, or a mobile phone. The host 1400 may use a command to make a request for a write operation, a read operation, an erase operation, or the like of the memory system 1000.

The controller 1200 and the memory device 1100 may be integrated into a single semiconductor device. In an embodiment, the controller 1200 and the memory device 1100 may be so integrated to form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

In another embodiment, the controller 1200 and the memory device 1100 may be integrated into a single semiconductor device to form a solid state drive (SSD). The SSD may include a storage device configured to store data to a semiconductor memory. When the memory system 1000 is used as the SSD, the operating speed of the host 1400 coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
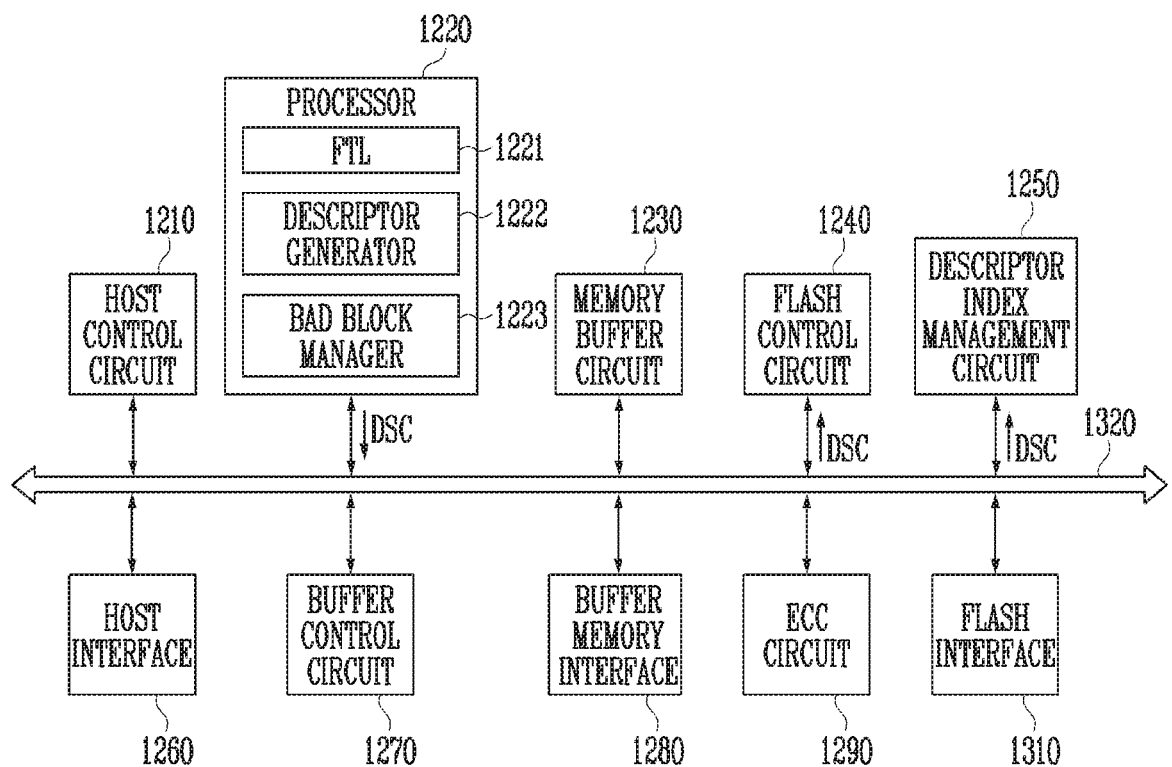
FIG. 2 is a block diagram illustrating a configuration of a controller of FIG. 1 in accordance with an embodiment of the present disclosure.

FIG. 2 is a diagram illustrating a configuration of the controller 1200 of FIG. 1.

Referring to FIG. 2, the controller 1200 may include a host control circuit 1210, a processor 1220, a memory buffer circuit 1230, a flash control circuit 1240, a descriptor index management circuit 1250, a host interface 1260, a buffer control circuit 1270, a buffer memory interface 1280, an error correction code (ECC) circuit 1290, a flash interface 1310, and a bus 1320.

The bus 1320 may provide a channel between the components of the controller 1200.

The host control circuit 1210 may control data transmission between the host 1400 of FIG. 1, the host interface 1260, and a controller buffer memory, i.e., the memory buffer circuit 1230 or the buffer memory 1300 of FIG. 1. In an embodiment, the host control circuit 1210 may control an operation of buffering data input from the host 1400 to the memory buffer circuit 1230 or the buffer memory 1300 via the host 1o Interface 1260. In an embodiment, the host control circuit 1210 may control an operation of outputting data buffered to the memory buffer circuit 1230 or the buffer memory 1300 to the host 1400 via the host interface 1260.

The processor 1220 may control the overall operation of the controller 1200 and perform a logical operation. The processor 1220 may communicate with the host 1400 of FIG. 1 through the host interface 1260, and communicate with the memory device 1100 of FIG. 1 through the flash interface 1310. The processor 1220 may communicate with the buffer memory 1300 of FIG. 1 through the buffer memory interface 1280. The processor 1220 may control the memory buffer circuit 1230 through the buffer control circuit 1270. The processor 1220 may control the operation of the memory system 1000 using the memory buffer circuit 1230 as an operation memory, a cache memory, or a buffer memory.

Furthermore, the processor 1220 may generate and output one or more descriptors DSC in response to a write request, a read request, or an erase request of the host 1400. A descriptor DSC may refer to a work order describing work to be processed by the flash control circuit 1240 to control the memory device 1100.

The processor 1220 may include a flash translation layer (hereinafter, referred to as "FTL") 1221, a descriptor generator 1222, and a bad block manager 1223.

The FTL 1221 may run firmware stored in the memory buffer circuit 1230 or the buffer memory 1300 of FIG. 1. During a data write operation, the FTL 1221 may map a physical address corresponding to a logical address input from the host 1400 of FIG. 1. Furthermore, during a data read operation, the FTL 1221 may check a physical address mapped to a logical address input from the host 1400. The physical address translated or checked during the write operation or the read operation may be transmitted to the descriptor generator 1222. The physical address may be included in a generated descriptor DSC.

The descriptor generator 1222 may generate and output a descriptor DSC describing work to be processed by the flash control circuit 1240 according to the firmware that runs in the FTL 1221. The descriptor generator 1222 may generate and output one or more descriptors DSC.

When an error occurs in a memory block (i.e., a bad block) during an operation of the memory device 1100 of FIG. 1, the descriptor generator 1222 may error mark a descriptor DSC corresponding to the error as a fail descriptor. Thereafter, the descriptor index management circuit 1250 may allocate a new memory block to at least one descriptor corresponding to the bad block, remove the error mark of the fail descriptor, and then re-output the descriptor DSC without the error mark as a normal descriptor DSC.

The bad block manager 1223 may receive information about memory blocks in which operation errors have occurred during overall operations (a write operation, a read operation, an erase operation, etc.) of the memory device 1100 of FIG. 1, and register the memory blocks in which the errors have occurred as bad blocks and manage the bad blocks. The bad block information may be stored to any one of the plurality of semiconductor memories 100 of FIG. 1.

The memory buffer circuit 1230 may be used as an operation memory, a cache memory, or a buffer memory of the processor 1220. The memory buffer circuit 1230 may store codes and commands to be executed by the processor 1220. The memory buffer circuit 1230 may store data to be processed by the processor 1220. The memory buffer 1230 may include a static RAM (SRAM) or a dynamic RAM (DRAM). The memory buffer circuit 1230 may store a plurality of descriptors DSC generated by the processor 1220, and may store descriptor indexes which are generated and managed by the descriptor index management circuit 1250.

The flash control circuit 1240 may generate and output command control signals for controlling the memory device 1100 in response to at least one descriptor DSC output from the processor 1220. During a write operation, the flash control circuit 1240 may control, in response to a descriptor DSC, an operation of transmitting and programming, to the memory device 1100, data buffered to the memory buffer circuit 1230 or the buffer memory 1300 of FIG. 1. In an embodiment, during a read operation, the flash control circuit 1240 may control, in response to a descriptor DSC, an operation of buffering, to the memory buffer circuit 1230 or the buffer memory 1300, data read and output from the memory device 1100.

The descriptor index management circuit 1250 may generate and manage descriptor indexes corresponding to respective descriptors DSC generated by the processor 1220. For example, if the processor 1220 generates a descriptor DSC, the descriptor index management circuit 1250 may generate a descriptor index corresponding to the generated descriptor DSC. Furthermore, the flash control circuit 1240 controls the memory device 1100 of FIG. 1 to perform an operation corresponding to the descriptor DSC. If, after the memory device 1100 has successfully completed the operation, the flash control circuit 1240 reports the completion of the operation, the descriptor index management circuit 1250 may delete the descriptor index corresponding to the descriptor DSC associated with the completed operation.

In addition, if an error occurs while the memory device 1100 performs an operation, the descriptor index management circuit 1250 may search for a descriptor index corresponding to a block in which the error has occurred, i.e., a bad block, among residual descriptor indexes and transmit the descriptor index found in the search to the processor 1220.

In an embodiment, the descriptor index management circuit 1250 may generate a descriptor index, and may store the generated descriptor index to the memory buffer circuit 1230 and manage it.

In an embodiment, the descriptor index management circuit 1250 may be a component in the processor 1220.

The host interface 1260 may communicate with the host 1400 of FIG. 1 under control of the processor 1220. The host interface 1260 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1270 may control the memory buffer circuit 1230 under control of the processor 1220.

The buffer memory interface 1280 may communicate with the buffer memory 1300 of FIG. 1 under control of the processor 1220. The buffer memory interface 1280 may communicate a command, an address, and data with the buffer memory 1300 through channels.

The ECC circuit 1290 may perform error correction. The ECC circuit 1290 may perform ECC encoding based on data to be written to the memory device 1100 of FIG. 1 through the flash interface 1310. ECC encoded data may be transmitted to the memory device 1100 through the flash interface 1310. The ECC circuit 1290 may perform ECC decoding for data received from the memory device 1100 through the flash interface 1310. For example, the ECC circuit 1290 may be a component in the flash interface 1310.

The flash interface 1310 may communicate with the memory device 1100 of FIG. 1 under control of the processor 1220. The flash interface 1310 may communicate control signals, an address, and data with the memory device 1100 through channels. In the case where the memory device 1100 has successfully completed an operation or an error has occurred so the operation has failed, the flash interface 1310 may receive a corresponding confirm signal.

Figure 3:
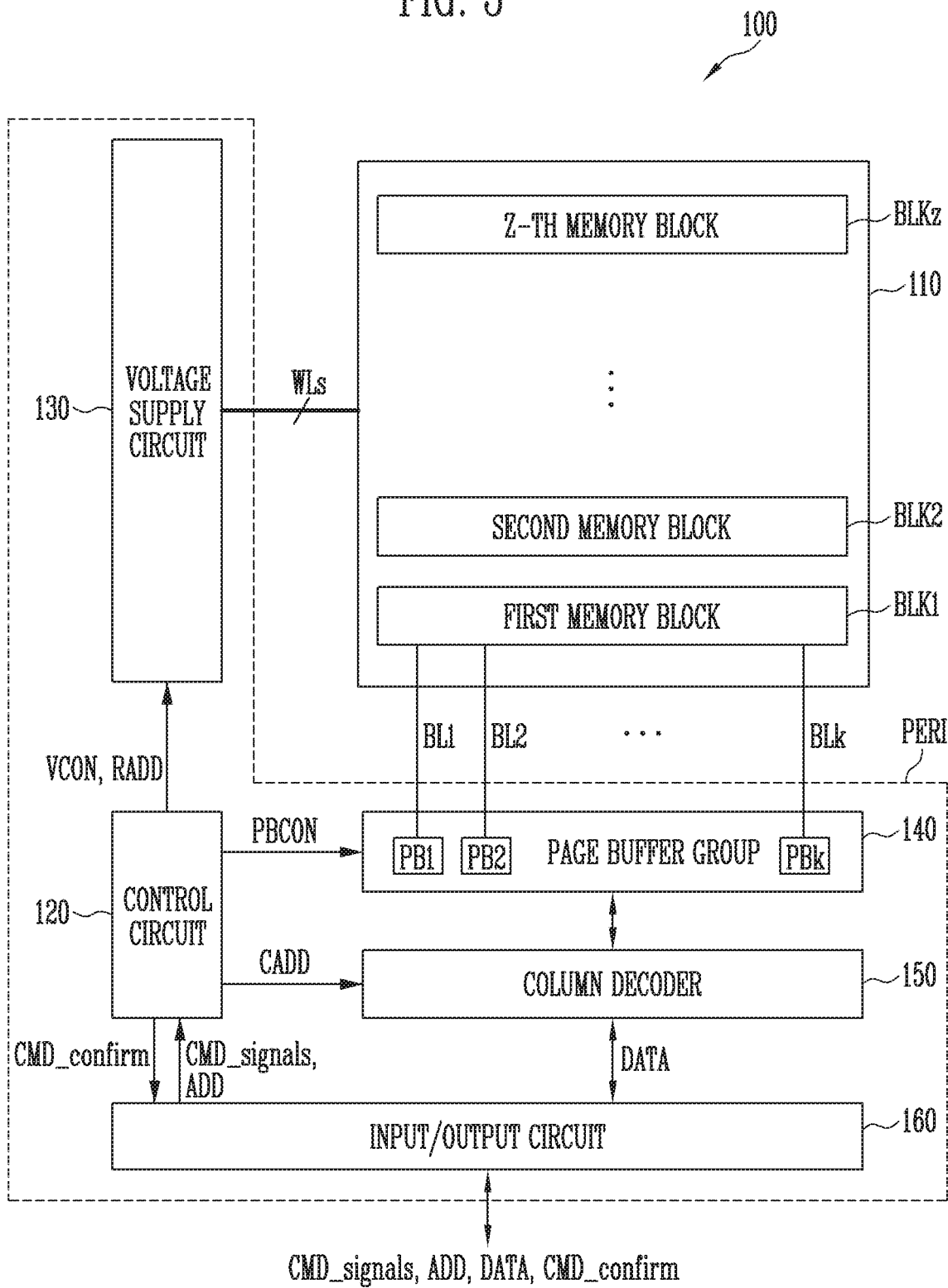
FIG. 3 is a block diagram illustrating a semiconductor memory of FIG. 1 in accordance with an embodiment of the present disclosure.

FIG. 3 is a block diagram illustrating the semiconductor memory 100 of FIG. 1 in accordance with an embodiment of the present disclosure.

Referring to FIG. 3, the semiconductor memory 100 may include a memory cell array 110 including a plurality of memory blocks BLK1 to BLKz, and a peripheral circuit PERI configured to perform a write operation, a read operation, or an erase operation on memory cells included in a selected page of the plurality of memory blocks BLK1 to BLKz. The peripheral circuit PERI may include a control circuit 120, a voltage supply circuit 130, a page buffer group 140, a column decoder 150, and an input/output circuit 160.

The memory cell array 110 may include the plurality of memory blocks BLK1 to BLKz. Each of the plurality of memory blocks BLK1 to BLKz may include a plurality of pages. Each of the plurality of pages may include a plurality of memory cells. In an embodiment, the plurality of memory cells may be nonvolatile memory cells. This will be described in more detail with reference to FIGS. 4 and 5.

The control circuit 120 may output a voltage control signal VCON for generating a voltage needed to perform a write operation, a read operation, or an erase operation in response to command signals CMD_signals input from an external device through the input/output circuit 160, and output a PB control signal PBCON for controlling page buffers PB1 to PBk in the page buffer group 140 depending on the type of operation. The control circuit 120 may output a row address signal RADD and a column address signal CADD in response to an address signal ADD input from the external device through the input/output circuit 160. Furthermore, after the write operation, the read operation, or the erase operation has been performed, the control circuit 120 may output a result of the operation as a confirm signal CMD_confirm. In other words, after the write operation, the read operation, or the erase operation has been performed, the control circuit 120 may output a confirm signal CMD_confirm for indicating whether the performed operation has been successfully completed, or an error has occurred in the performed operation.

The voltage supply circuit 130 may supply operating voltages needed for a write operation, a read operation, and an erase operation of memory cells to local lines of a selected memory block including a drain select line, word lines WLs, and a source select line, in response to the voltage control signal VCON of the control circuit 120. The voltage supply circuit 130 may include a voltage generating circuit and a row decoder.

The voltage generating circuit may output the operating voltages needed for the write operation, the read operation, and the erase operation of the memory cells to global lines, in response to the voltage control signal VCON of the control circuit 120.

The row decoder may couple, in response to row address signals RADD of the control circuit 120, the global lines to the local lines such that the operating voltages output from the voltage generating circuit to the global lines may be transmitted to the local lines of the selected memory block in the memory cell array 110.

The page buffer group 140 may include a plurality of page buffers PB1 to PBk coupled with the memory cell array 110 through bit lines BL1 to BLk. In response to a PB control signal PBCON of the control circuit 120, the page buffers PB1 to PBk may selectively precharge the bit lines BL1 to BLk depending on input data to be stored to the memory cells, or may sense voltages of the bit lines BL1 to BLk so as to read out data from the memory cells.

The column decoder 150 may select the page buffers PB1 to PBk in response to a column address signal CADD output from the control circuit 120. In other words, the column decoder 150 may successively transmit data DATA to be stored to the memory cells, to the page buffers PB1 to PBk in response to the column address signal CADD. Furthermore, during a read operation, the column decoder 150 may successively select the page buffers PB1 to PBk in response to a column address signal CADD such that data DATA of memory cells latched to the page buffers PB1 to PBk may be output to the external device.

During a write operation, the input/output circuit 160 may transmit input data DATA to be stored to the memory cells, to the column decoder 150 under control of the control circuit 120 so that the data DATA may be input to the page buffer group 140. When the column decoder 150 transmits the data DATA transmitted from the input/output circuit 160 to the page buffers PB1 to PBk, the page buffers PB1 to PBk may store the input data DATA to internal latch circuits thereof. During a read operation, the input/output circuit 160 may output, to the external device, data DATA transmitted from the page buffers PB1 to PBk through the column decoder 150.

Figure 4:
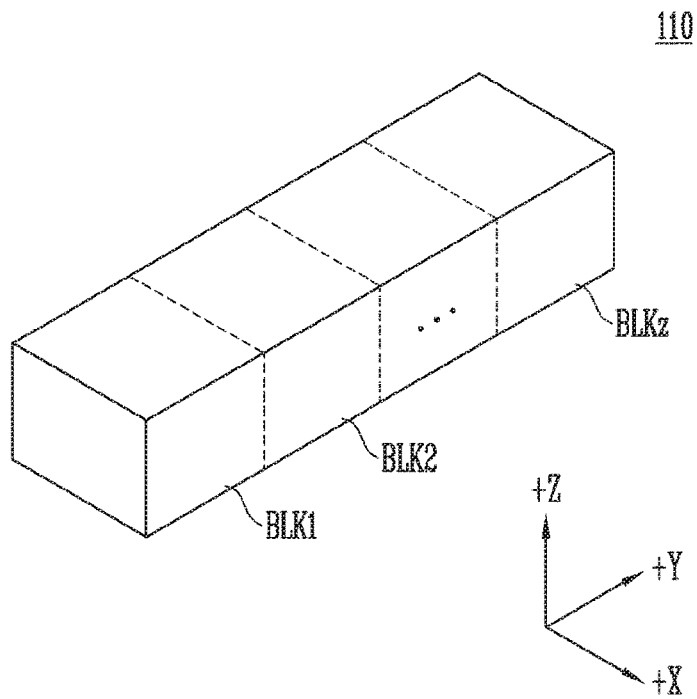
FIG. 4 is a block diagram illustrating a memory cell array of FIG. 3 in accordance with an embodiment of the present disclosure.

FIG. 4 is a block diagram illustrating the memory cell array 110 of FIG. 3 in accordance with an embodiment of the present disclosure.

Referring to FIG. 4, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIG. 5.

Figure 5:
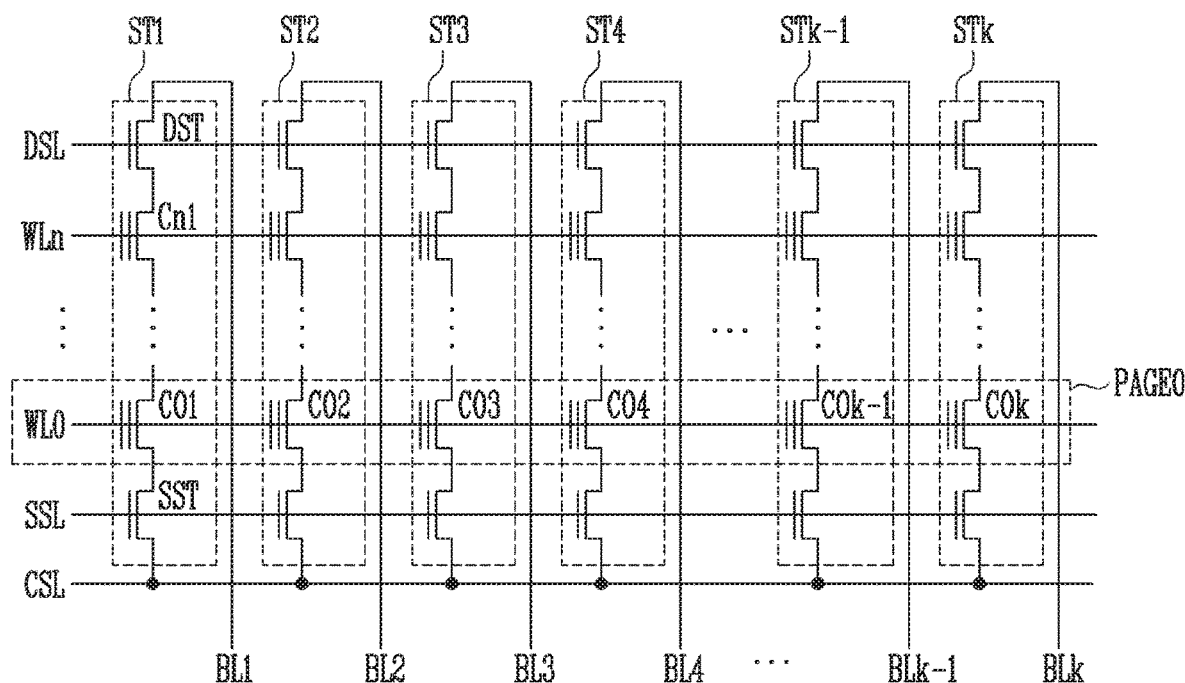
FIG. 5 is a circuit diagram illustrating a memory block shown in FIG. 4 in accordance with an embodiment of the present disclosure.

FIG. 5 is a circuit diagram illustrating a memory block shown in FIG. 4 in accordance with an embodiment of the present disclosure.

Referring to FIG. 5, each memory block may include a plurality of strings ST1 to STk coupled between the bit lines BL1 to BLk and a common source line CSL. In other words, the strings ST1 to STk may be respectively coupled with the corresponding bit lines BL1 to BLk and coupled in common with the common source line CSL. Each string, e.g., ST1, may include a source select transistor SST having a source coupled to the common source line CSL, a plurality of memory cells C01 to Cn1, and a drain select transistor DST having a drain coupled to the bit line BL1. The memory cells C01 to Cn1 may be coupled in series between the select transistors SST and DST. A gate of the source select transistor SST may be coupled to the source select line SSL. Gates of the memory cells C01 to Cn1 may be respectively coupled to the word lines WL0 to WLn. A gate of the drain select transistor DST may be coupled to the drain select line DSL.

The memory cells in the memory block may be divided on a physical page basis or on a logical page basis. For example, memory cells C01 to C0$k$ coupled to a single word line (e.g., WL0) may form a single physical page PAGE0. A page may be the basic unit of a program operation or a read operation.

Figure 6:
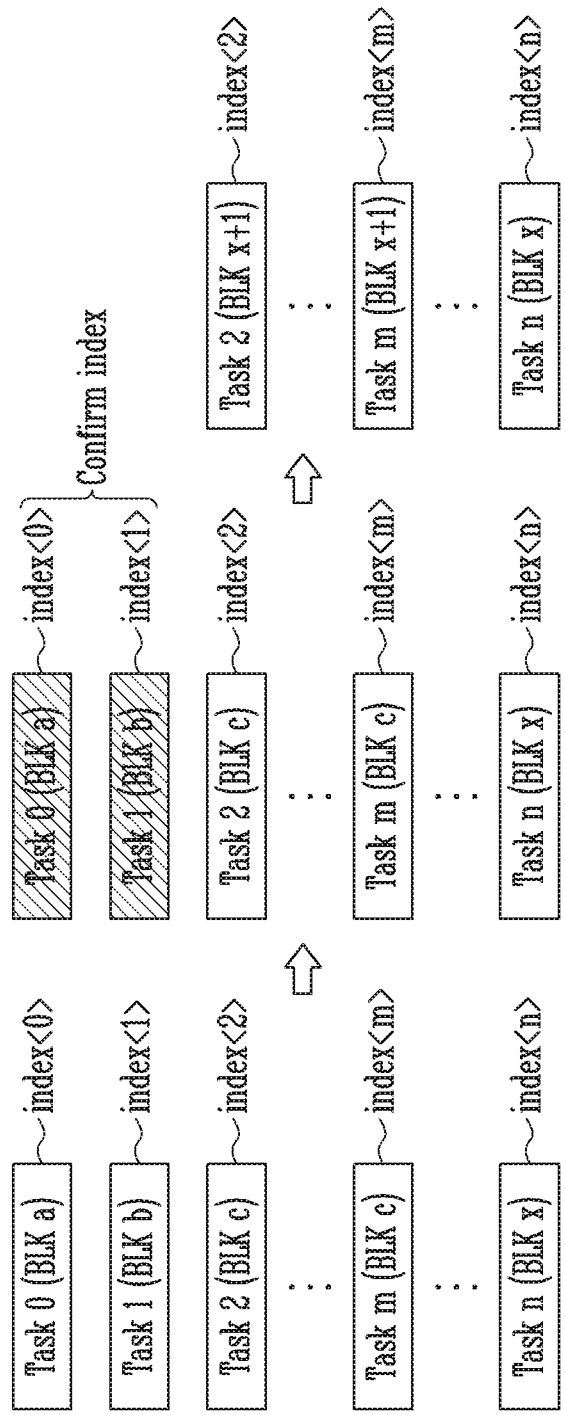
FIG. 6 is a diagram illustrating a method of managing indexes corresponding to descriptors in accordance with an embodiment of the present disclosure.

FIG. 6 is a diagram illustrating descriptor indexes which are managed by the descriptor index management circuit 1250 in accordance with an embodiment of the present disclosure.

Figure 7:
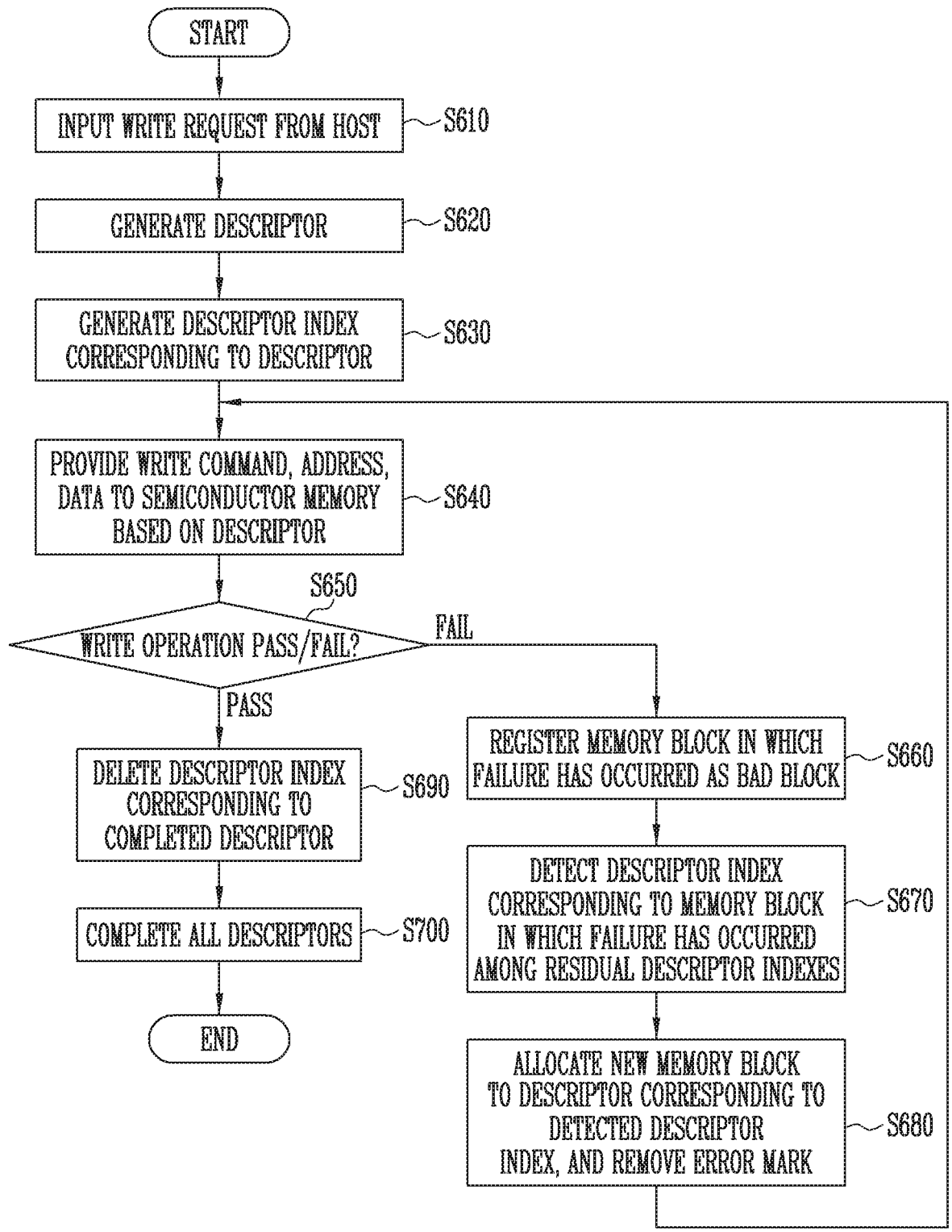
FIG. 7 is a flowchart illustrating the operation of the memory system in accordance with an embodiment of the present disclosure.

FIG. 7 is a flowchart illustrating the operation of the memory system 1000 in accordance with an embodiment of the present disclosure.

A method of operating the memory system 1000 in accordance with an embodiment of the present disclosure will be described with reference to FIGS. 1 to 7.

The case where a plurality of write requests are input from the host 1400 will be described by way of example.

The controller 1200 of the memory system 1000 may receive one or more write requests from the host 1400 at step S610. The controller 1200 may temporarily store write data received along with the one or more write requests to the buffer memory 1300 or the memory buffer circuit 1230.

The processor 1220 of the controller 1200 may map, to physical addresses, logical addresses received along with the one or more write requests, and may generate one or more descriptors DSC in response to the one or more write requests and the mapped physical addresses at step S620.

The descriptor index management circuit 1250 may generate one or more descriptor indexes using the one or more descriptors DSC generated by the processor 1220. Referring to FIGS. 2 and 6, the descriptor index management circuit 1250 may generate a plurality of tasks Task 0 to Task n corresponding to the respective descriptors DSC, and may generate a plurality of descriptor indexes index<0> to index<n> corresponding to the respective plurality of tasks Task 0 to Task n. In other words, a single descriptor index corresponding to each descriptor may be generated. The plurality of descriptor indexes index<0> to index<n> may include block information BLK a to BLK x of the respective semiconductor memories 100 on which operations are to be performed in response to the corresponding descriptors. Some of the plurality of descriptor indexes may have duplicate block information (e.g., BLK c). This may mean that a plurality of descriptors correspond to the same memory block (e.g., BLK c).

In response to the descriptor(s) DSC generated from the processor 1220, the flash control circuit 1240 may output addresses ADD mapped to logical addresses and command control signals CMD_signals, for controlling one or more semiconductor memories selected from among the plurality of semiconductor memories 100 in the memory device 1100, to the selected one or more semiconductor memories. Here, the write data temporarily stored in the buffer memory 1300 or the memory buffer circuit 1230 may also be output to the selected one or more semiconductor memories at step S640.

The selected one or more semiconductor memories 100 may perform write operations in response to the received command control signals CMD_signals, the addresses ADD and the write data DATA.

If the write operations have been completed, the control circuit 120 of each selected semiconductor memory 100 may generate and output a confirm signal CMD_confirm based on a result of the corresponding completed write operation, thus reporting whether the write operation has passed/failed.

The controller 1200 may check whether the write operation of the semiconductor memory 100 on which the write operation has been completed has passed/failed, based on the confirm signal CMD_confirm received from the semiconductor memory 100 on which the write operation has been completed at step S650.

If the confirm signal CMD_confirm received from the semiconductor memory 100 on which the write operation has been completed indicates that the write operation has passed ("PASS" at step S650), the descriptor index management circuit 1250 may remove a descriptor index corresponding to the completed descriptor at step S690. Referring to FIG. 6, if the write operations of the memory blocks BLKa and BLKb of the selected semiconductor memories 100 are determined to have passed, the descriptor index management circuit 1250 may remove descriptor indexes (Confirm index; index<0> and index<1>) corresponding to the memory blocks BLK a and BLK b on which the write operations are determined to have passed.

If all operations corresponding to the descriptors DSC of the selected semiconductor memories 100 are successfully completed at step S700 and all of the residual descriptor indexes are removed at the step S690, the plurality of write operations may be terminated.

Returning to step S650, if the confirm signal CMD_confirm received from the semiconductor memory 100 on which the write operation has been completed indicates that the write operation has failed ("FAIL" at step S650), the bad block manager 1223 of the processor 1220 may register, as a bad block, a memory block (e.g., BLK c) of the semiconductor memory 100 in which a failure has occurred at step S660. Furthermore, the processor 1220 may error mark a descriptor DSC corresponding to the failed write operation.

After step S660, the descriptor index management circuit 1250 may search for a descriptor index corresponding to the bad block, i.e., the memory block (e.g., BLK c) in which the write operation failure has occurred, among residual descriptor indexes at step S670. The residual descriptor indexes may be descriptor indexes, other than descriptor indexes removed in response to confirm signals corresponding to the successfully completed write operation among the plurality of descriptor indexes. Referring to FIG. 6, among the residual descriptor indexes index<2> to index<n>, descriptor indexes (e.g., index<2> and index<m>) corresponding to the bad block BLK c are searched for.

The descriptor generator 1222 of the processor 1220 may generate and output new descriptors DSC based on the descriptor indexes (e.g., index<2> and index<m>) corresponding to the bad block BLK c searched for by the descriptor index management circuit 1250. In an embodiment, the descriptor generator 1222 may generate and output new descriptors DSC corresponding to the descriptor indexes index<2> and index<m>, and a new memory block (e.g., BLK x+1) may be allocated to the new descriptors DSC at step S680. In addition, the descriptor generator 1222 may remove the error mark added at step S660 and generate a new descriptor DSC, and may output the generated new descriptor DSC to the flash control circuit 1240. Thereafter, the process may return to step S640 and be re-performed from step S640.

In the above-mentioned embodiments, the case where a plurality of write operations are performed has been described by way of example, but the present disclosure is not limited thereto. For example, the embodiments of the present disclosure may also be applied to the case where a plurality of write operations, read operations and/or erase operations are performed.

As described above, in accordance with embodiments of the present disclosure, if a failure occurs during an operation of the memory system, a descriptor corresponding to a memory block in which the failure has occurred may be searched for among descriptors corresponding to memory blocks on which operations have not been completed, and a new memory block may be allocated to the descriptor found in the search. As a result, the memory block on which the failure has occurred may be prevented from being registered in duplicate as a bad block during a subsequent operation.

Figure 8:
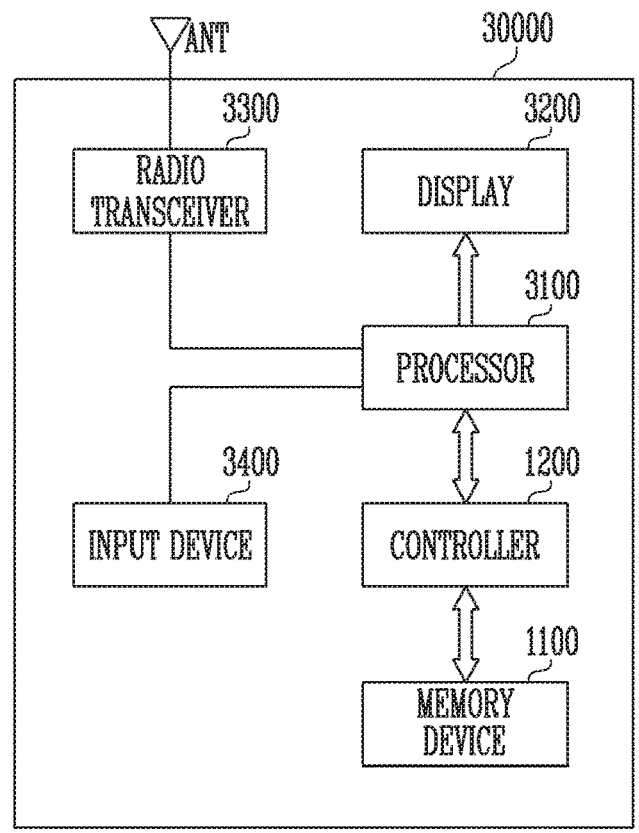
FIG. 8 is a diagram illustrating a memory system in accordance with an embodiment of the present disclosure.

FIG. 8 is a diagram illustrating a memory system 30000 in accordance with an embodiment of the present disclosure.

Referring to FIG. 8, the memory system 30000 may be embodied in a cellular phone, a smartphone, a tablet PC, a personal digital assistant (PDA) or a wireless communication device. The memory system 30000 may include a memory device 1100, and a controller 1200 capable of controlling the operation of the memory device 1100. The controller 1200 may control a data access operation, e.g., a program operation, an erase operation, or a read operation, of the memory device 1100 under control of a processor 3100. The descriptor index management circuit 1250 of FIG. 2 may be included as a component of the processor 3100.

Data programmed to the memory device 1100 may be output through a display 3200 under control of the controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the controller 1200 or the display 3200. The controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the controller 1200, data output from the radio transceiver 3300, or data output form the input device 3400 is output through the display 3200.

In an embodiment, the controller 1200 capable of controlling the operation of the memory device 1100 may be embodied as a part of the processor 3100 or a chip provided separately from the processor 3100. Alternatively, the controller 1200 may be configured in accordance with the controller shown in FIG. 2.

Figure 9:
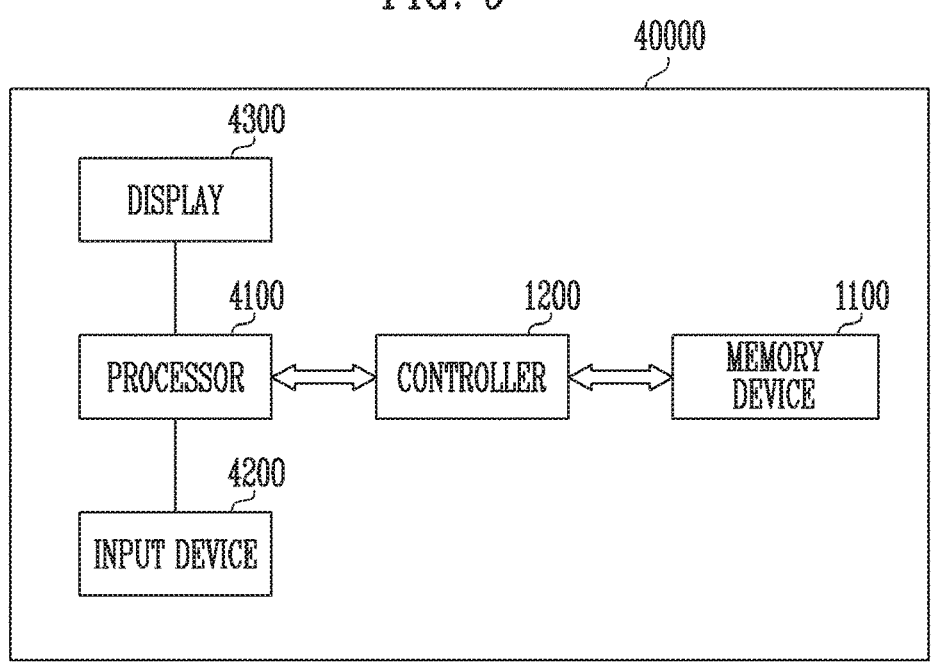
FIG. 9 is a diagram illustrating a memory system in accordance with an embodiment of the present disclosure.

FIG. 9 is a diagram illustrating a memory system 40000 in accordance with an embodiment of the present disclosure.

Referring to FIG. 9, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a controller 1200 capable of controlling a data processing operation of the memory device 1100.

A processor 4100 may output data stored in the memory device 1100 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 1200. In an embodiment, the controller 1200 capable of controlling the operation of the memory device 1100 may be embodied as a part of the processor 4100 or a chip provided separately from the processor 4100. Alternatively, the controller 1200 may be configured in accordance with the controller shown in FIG. 2. The descriptor index management circuit 1250 of FIG. 2 may be included as a component of the processor 4100.

Figure 10:
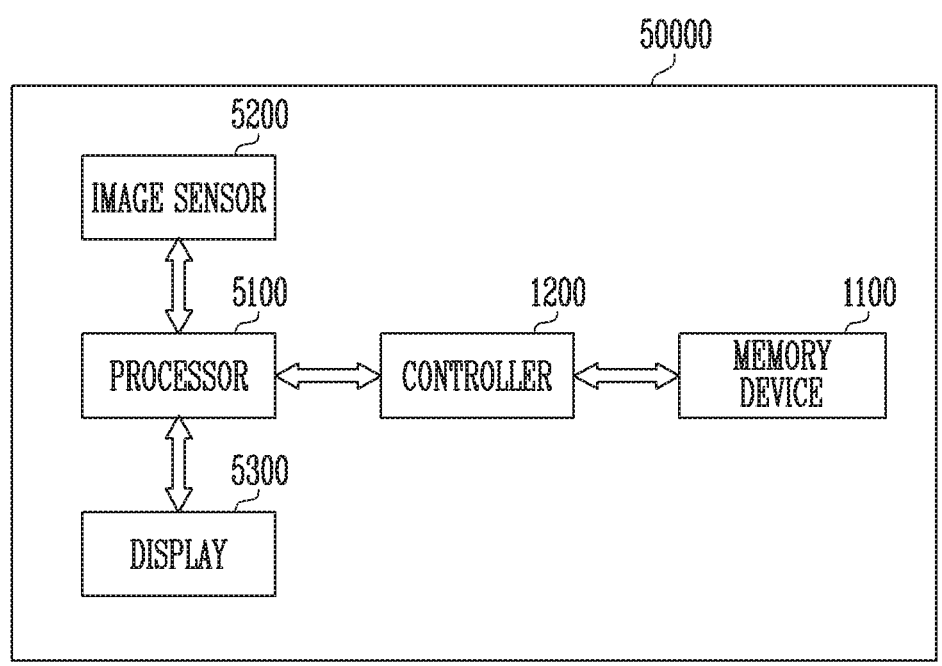
FIG. 10 is a diagram illustrating a memory system in accordance with an embodiment of the present disclosure.

FIG. 10 is a diagram illustrating a memory system 50000 in accordance with an embodiment of the present disclosure.

Referring to FIG. 10, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored to the memory device 1100 through the controller 1200. Data stored in the memory device 1100 may be output through the display 5300 under control of the processor 5100 or the controller 1200.

In an embodiment, the controller 1200 capable of controlling the operation of the memory device 1100 may be embodied as a part of the processor 5100 or a chip provided separately from the processor 5100. Alternatively, the controller 1200 may be configured in accordance with the controller shown in FIG. 2. The descriptor index management circuit 1250 of FIG. 2 may be included as a component of the processor 5100.

Figure 11:
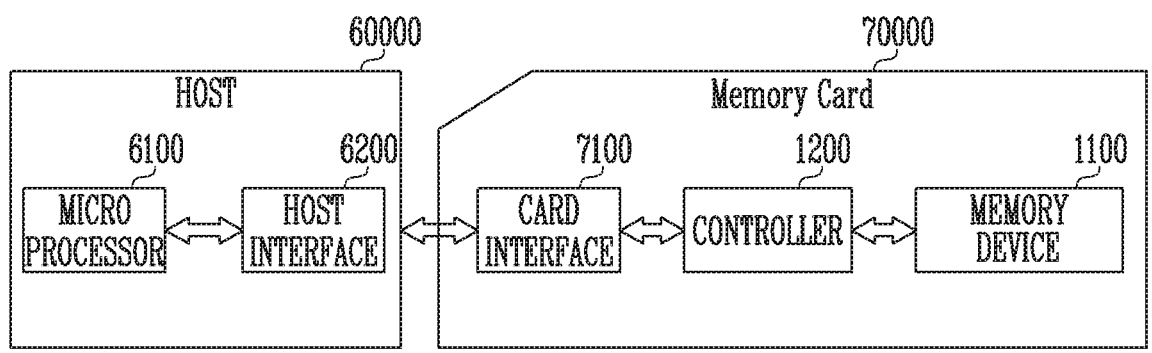
FIG. 11 is a diagram illustrating a memory system in accordance with an embodiment of the present disclosure.

FIG. 11 is a diagram illustrating a memory system 70000 in accordance with an embodiment of the present disclosure.

Referring to FIG. 11, the memory system 70000 may be embodied in a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto. The controller 1200 may be configured in accordance with the controller 1200 shown in FIG. 2.

The card interface 7100 may interface data exchange between a host 60000 and the controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under control of a microprocessor 6100.

In accordance with embodiments of the present disclosure, if a failure occurs during an operation of the memory system, a descriptor corresponding to a memory block in which the failure has occurred may be searched for, among descriptors corresponding to memory blocks on which operations have not been performed or completed, and a new memory block may be allocated to the descriptor found in the search. As a result, the memory block in which the failure has occurred may be prevented from being registered in duplicate as a bad block during a subsequent operation.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a memory device comprising a plurality of semiconductor devices each including a plurality of memory blocks; and
a controller configured to generate at least one or more descriptors in response to a request from a host, and control internal operations of the plurality of semiconductor devices based on the respective at least one or more descriptors,
wherein the controller generates and manages at least one or more descriptor indexes respectively corresponding to the at least one or more descriptors, and
wherein, when a failure occurs during the internal operations of the plurality of semiconductor devices, at least one descriptor corresponding to a memory block in which the failure has occurred is searched for using the at least one or more descriptor indexes.

2. The memory system according to claim 1, wherein the controller allocates a new memory block to the at least one descriptor corresponding to the memory block in which the failure has occurred, and generates a new descriptor for the new memory block.

3. The memory system according to claim 1, wherein the controller comprises:
a processor configured to control overall operation of the controller in response to the request from the host, and generate the at least one or more descriptors;
a flash control circuit configured to generate command control signals for controlling the plurality of semiconductor devices to perform the internal operations based on the at least one or more descriptors; and
a descriptor index management circuit configured to generate and manage the at least one or more descriptor indexes.

4. The memory system according to claim 3, wherein the processor comprises:
a flash translation layer configured to generate a mapping address by mapping a logical address received from the host to a physical address;
a descriptor generator configured to generate the at least one or more descriptors in response to the request from the host and the mapping address; and
a bad block manager configured to register the memory block in which the failure has occurred as a bad block and manage the bad block.

5. The memory system according to claim 4, wherein, when the failure occurs during the internal operations, the descriptor generator error marks one descriptor corresponding to the internal operation in which the failure has occurred among the at least one or more descriptors.

6. The memory system according to claim 5, wherein the plurality of semiconductor devices perform the internal operations in response to the command control signals, and output results of the internal operations to the controller as confirm signals.

7. The memory system according to claim 6, wherein, when each of the internal operations is properly completed, the descriptor index management circuit removes, based on the corresponding confirm signal, a descriptor index corresponding to the internal operation that has been properly completed among the at least one or more descriptor indexes.

8. The memory system according to claim 7, wherein, when any one of the internal operations fails, the descriptor index management circuit detects, based on the corresponding confirm signal, at least one descriptor index corresponding to the memory block in which the failure has occurred among residual descriptor indexes.

9. The memory system according to claim 8, wherein each of the at least one or more descriptor indexes includes information about the corresponding memory block on which the associated internal operation is to be performed.

10. The memory system according to claim 8, wherein the descriptor generator allocates a new memory block to the at least one descriptor corresponding to the memory block in which the failure has occurred, and generates and outputs a new descriptor for the corresponding memory block.

11. The memory system according to claim 10, wherein the descriptor generator removes the error mark from the one descriptor, and allocates the new memory block to the one descriptor to generate the new descriptor.

12. A method of operating a memory system, comprising:
generating a plurality of descriptors and a plurality of descriptor indexes corresponding to the plurality of descriptors in response to a request received from a host;
controlling a plurality of semiconductor memories to perform internal operations based on the plurality of descriptors;
registering, when a failure occurs during the internal operations, a memory block in which the failure has occurred as a bad block;
searching for at least one descriptor index corresponding to the memory block in which the failure has occurred among the plurality of descriptor indexes; and
generating at least one new descriptor based on the at least one descriptor index found in the searching.

13. The method according to claim 12, wherein each of the plurality of descriptor indexes includes information of a memory block on which a corresponding internal operation is to be performed.

14. The method according to claim 12, wherein, when each of the internal operations is properly completed, a descriptor index corresponding to each internal operation that has been properly completed, among the plurality of descriptor indexes, is removed.

15. The method according to claim 12, wherein a new memory block is allocated to the at least one new descriptor.

16. The method according to claim 12, wherein the descriptor corresponding to the internal operation in which the failure has occurred among the plurality of descriptors is error marked.

17. The method according to claim 16, wherein the at least one new descriptor is generated by allocating a new memory block to the error marked descriptor and removing the error mark.

18. The method according to claim 12, wherein each of the plurality of semiconductor memories comprises a plurality of memory blocks.

19. The method according to claim 12, wherein an identical memory block of an identical semiconductor memory is allocated to some descriptors of the plurality of descriptors.

20. A memory system comprising:
a plurality of memory devices each including a plurality of memory blocks; and
a controller configured to generate a plurality of descriptors and respectively corresponding indexes for controlling the memory devices to perform operation to the memory blocks, the indexes including information of the memory blocks respectively allocated for the operations,
wherein the controller allocates, when an operation fails to a bad block among the memory blocks, another memory block for one or more descriptors corresponding to the bad block among the descriptors by using the indexes.

* * * * *